United States Patent
Takagi

(10) Patent No.: US 9,159,789 B2
(45) Date of Patent: Oct. 13, 2015

(54) FIELD EFFECT TRANSITOR AND SEMICONDUCTOR DEVICE USING THE SAME

(71) Applicant: KABUSHIKI KAISHA TOSHIBA, Minato-ku (JP)

(72) Inventor: Kazutaka Takagi, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/063,390

(22) Filed: Oct. 25, 2013

(65) Prior Publication Data
US 2014/0252416 A1 Sep. 11, 2014

(30) Foreign Application Priority Data
Mar. 6, 2013 (JP) ................................. 2013-044614

(51) Int. Cl.
| H01L 29/06 | (2006.01) |
| H01L 29/417 | (2006.01) |
| H01L 29/778 | (2006.01) |
| H01L 29/20 | (2006.01) |

(Continued)

(52) U.S. Cl.
CPC ...... *H01L 29/0696* (2013.01); *H01L 29/41758* (2013.01); *H01L 29/7786* (2013.01); *H01L 23/66* (2013.01); *H01L 24/06* (2013.01); *H01L 24/48* (2013.01); *H01L 24/49* (2013.01); *H01L 29/2003* (2013.01); *H01L 2223/6611* (2013.01);

(Continued)

(58) Field of Classification Search
CPC ..... H01L 21/338; H01L 21/28; H01L 29/812; H01L 29/778; H01L 29/44; H01L 27/95; H01L 29/0696

USPC ............ 257/194, 202–211, 76, 77, 279, 401, 257/341; 330/295
See application file for complete search history.

(56) References Cited

U.S. PATENT DOCUMENTS

| 6,020,613 A * | 2/2000 | Udomoto et al. ............. 257/341 |
| 2011/0018631 A1* | 1/2011 | Ng et al. ....................... 330/151 |
| 2012/0199847 A1 | 8/2012 | Takagi |

FOREIGN PATENT DOCUMENTS

| JP | 2007-243018 | * | 9/2007 | ............ H01L 21/338 |
| JP | 2008-141055 | | 6/2008 | |

(Continued)

OTHER PUBLICATIONS

Office Action issued Feb. 6, 2015 in Japanese Patent Application No. 2013-044614 (with Partial English Translation).

(Continued)

*Primary Examiner* — Matthew Landau
*Assistant Examiner* — Eric Ashbahian
(74) *Attorney, Agent, or Firm* — Oblon, McClelland, Maier & Neustadt, L.L.P.

(57) ABSTRACT

An field effect transistor has a plurality of cells provided on a first straight line. Each cell has a plurality of multi-finger electrodes and is connected to a gate terminal electrode and a drain terminal electrode. The multi-finger electrode has at least two finger gate electrodes, a finger drain electrode, and a finger source electrode. The gate terminal electrode connects the finger gate electrodes of two adjoining cells in common. The drain terminal electrode connects the finger drain electrodes of two adjoining cells in common. The finger gate electrode of one cell of two adjoining cells and the finger gate electrode of another cell of the two adjoining cells cross perpendicularly. The gate terminal electrode and the drain terminal electrode are provided alternately in a region where the finger gate electrodes of the two adjoining cells cross.

8 Claims, 10 Drawing Sheets

(51) Int. Cl.
*H01L 23/66* (2006.01)
*H01L 23/00* (2006.01)

(52) U.S. Cl.
CPC .............. *H01L 2223/6655* (2013.01); *H01L 2224/04042* (2013.01); *H01L 2224/06165* (2013.01); *H01L 2224/48227* (2013.01); *H01L 2224/49175* (2013.01); *H01L 2924/1033* (2013.01); *H01L 2924/10272* (2013.01); *H01L 2924/12032* (2013.01); *H01L 2924/1306* (2013.01); *H01L 2924/13064* (2013.01); *H01L 2924/19107* (2013.01); *H01L 2924/30107* (2013.01)

(56) References Cited

FOREIGN PATENT DOCUMENTS

| | | |
|---|---|---|
| JP | 2008-244295 A | 10/2008 |
| JP | 2008-311533 A | 12/2008 |
| JP | 2012-182386 A | 9/2012 |

OTHER PUBLICATIONS

U.S. Appl. No. 14/615,859, filed Feb. 6, 2015, Takagi, et al.

* cited by examiner $\gamma = \alpha g + \beta g$

COMPARATIVE EXAMPLE

COMPARATIVE EXAMPLE

COMPARATIVE EXAMPLE

COMPARATIVE EXAMPLE

FIELD EFFECT TRANSITOR AND SEMICONDUCTOR DEVICE USING THE SAME

CROSS-REFERENCE TO RELATED APPLICATION(S)

This application is based upon and claims the benefit of priority from the prior Japanese Patent Application No. 2013-044614, filed on Mar. 6, 2013, the entire contents of which are incorporated herein by reference.

FIELD

Embodiments of the present invention relate to a field effect transistor and a semiconductor device.

BACKGROUND

When an operation region (a gate width) of a field effect transistor which uses GaAs, SiC, GaN and so on is broadened, output power of devices, such as an inverter circuit, a switching circuit and a radio frequency amplification circuit, can be increased easily.

When a plurality of cells is arranged in parallel, the operation region can be broadened without lowering power gain. In this case, thermal resistance can be reduced by keeping properly intervals between each the cells which are the operation regions.

When a radio-frequency and high-power amplification circuit using an HEMT (High Electron Mobility Transistor) etc. comprises a plurality of cells, it is preferred to arrange the cells so that a loop oscillation may not be produced.

DETAILED DESCRIPTION

A field effect transistor of the embodiment includes a plurality of cells on a first straight line. Each cell has a multi-finger electrode which is provided on an active layer made of semiconductor and which controls an operation current. The multi-finger electrode has at least two finger gate electrodes and a finger drain electrode and finger source electrodes which sandwiches the each finger gate electrode. The finger gate electrode, the finger drain electrode and the finger source electrode are parallel each other in one cell. The field effect transistor includes of the embodiment includes gate terminal electrodes and drain terminal electrodes. Each finger gate electrode of two adjoining cells is connected common to the gate terminal electrode. Each finger drain electrode of two adjoining cells is connected common to the drain terminal electrode. The multi-finger electrodes of the two adjoining cells are line symmetry about a second straight line which crosses with the first straight line perpendicularly. An extension line of the finger gate electrode of one cell of two adjoining cells and an extension line of the finger gate electrode of another cell of the two adjoining cells cross at an angle of the range of 80-100 degrees. The gate terminal electrode and the drain terminal electrode are provided alternately in a region where the extension lines of the finger gate electrodes of the two adjoining cells cross.

Hereinafter, embodiments of the present invention will be described with reference to the drawings.

First Embodiment

Figure 1:
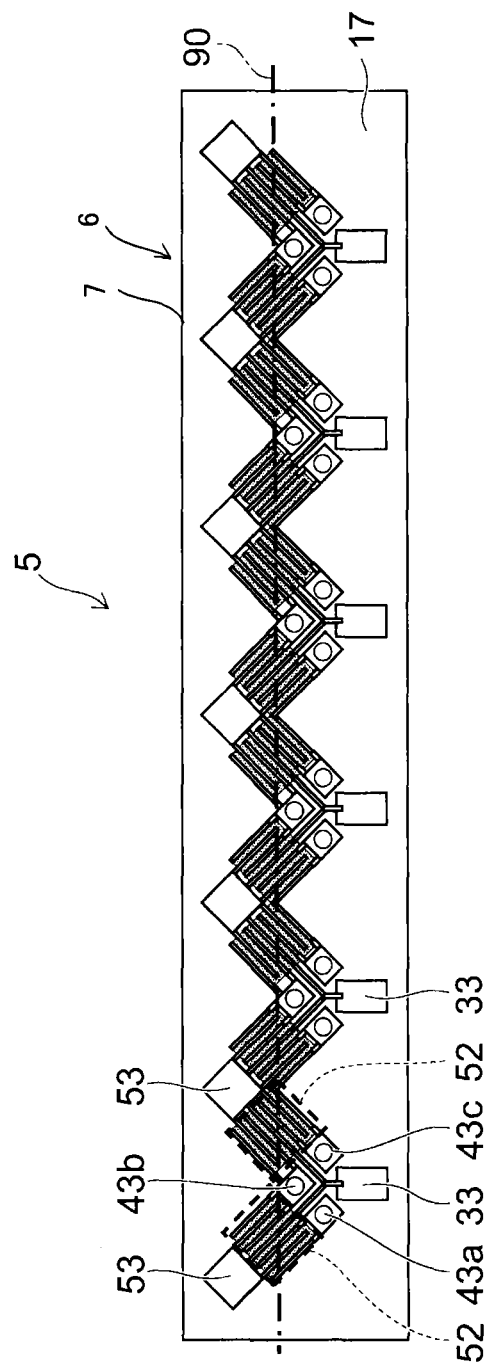
FIG. 1 is a schematic top view of a field effect transistor concerning a first embodiment.

FIG. 1 is a schematic top view of a field effect transistor concerning the first embodiment. The field effect transistor 5 has an active layer 17 which is made of a hexagonal system semiconductor, such as SiC and GaN, a plurality of cells 52, a plurality of gate terminal electrodes 33, a plurality of source terminal electrodes 43a, 43b and 43c, and a plurality of drain terminal electrodes 53. In FIG. 1, a reference number 6 denotes a semiconductor chip and the reference number 7 denotes a chip end face.

The plurality of cells 52 is provided on a first straight line 90, that is, is provided along the first straight line 90. Each cell has multi-finger electrode, and the multi-finger electrodes of the plurality of the cells 52 are provided along the first straight line 90 like a zigzag line. In addition, the gate terminal electrodes 33 and the drain terminal electrodes 53 are provided at both sides of the first straight line 90, respectively, bordering the first straight line 90, and are provided along the first straight line 90. That is, the gate terminal electrodes 33 and the drain terminal electrodes 53 are provided alternately at both sides of the first straight line 90.

Figure 2A:
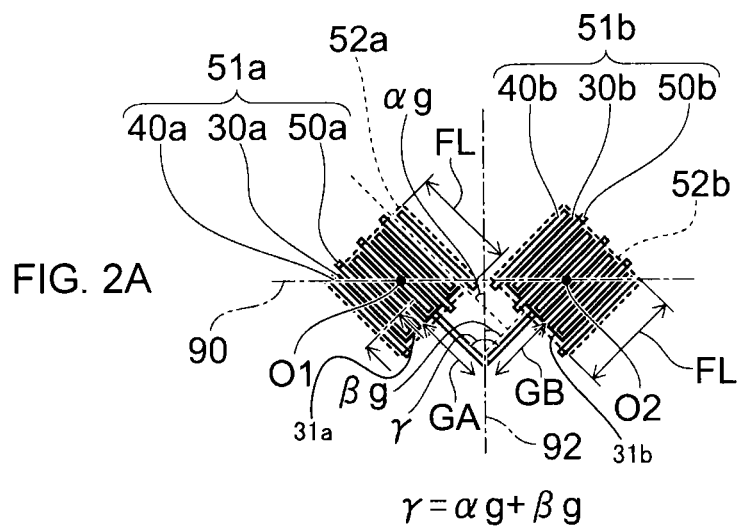
FIG. 2A is a schematic top view of two adjoining cells.
Figure 2B:
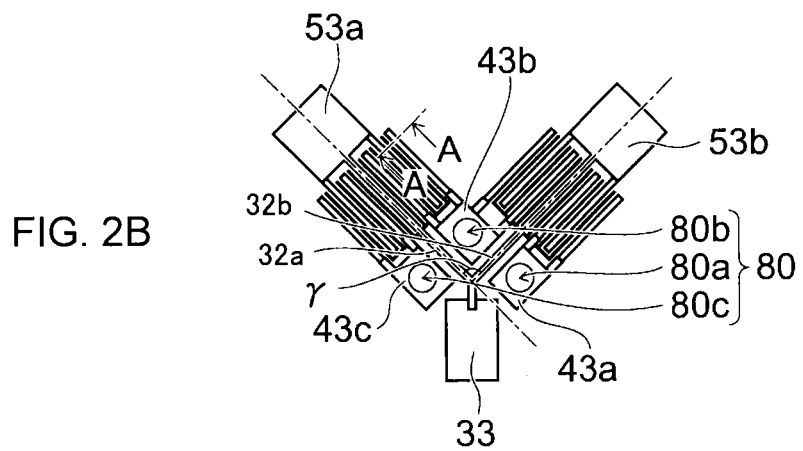
FIG. 2B is a schematic top view showing multi-finger electrodes and terminal electrodes.
Figure 2C:
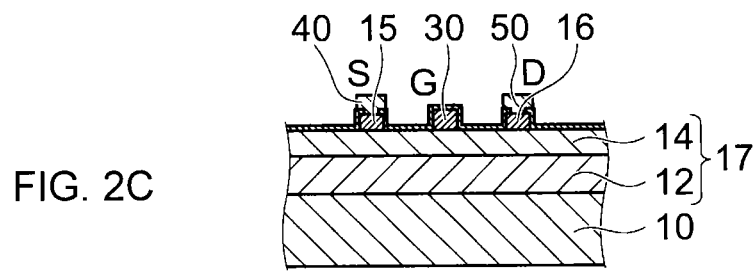
FIG. 2C is a schematic cross section which is taken along an A-A line of FIG. 2B.

FIG. 2A is a schematic top view of two adjoining cells, FIG. 2B is schematic top view of the multi-finger electrodes and the terminal electrodes, and FIG. 2C is a schematic cross section taken along an A-A line in FIG. 2B. The cells 52a and 52b include the multi-finger electrodes 51a and 51b provided on the active layer 17 which is made of semiconductor. In each cell 52a, 52b, a current is controlled by the multi-finger electrode 51a, 51b.

As shown in FIG. 2A, the first straight line 90 is defined as a straight line passing through the center O1 of the multi-finger electrode 51a and the center O2 of the adjoining multi-finger electrode 51b. A second straight line 92 is a straight line which crosses perpendicularly with the first straight line 90.

In addition, the multi-finger electrode 51a and the multi-finger electrode 51b are line symmetric to a straight line which is parallel to the second straight line 92.

The multi-finger electrode 51 includes a plurality of finger gate electrodes 30, a plurality of finger drain electrodes 50 and a plurality of finger source electrodes 40. The finger drain electrode 50 and the finger source electrode 40 are provided so that the finger gate electrode 30 may be inserted therebetween. In one cell, the finger gate electrodes 30, the finger drain electrodes 50, and the finger source electrodes 40 are parallel mutually.

When a gate length of the finger gate electrode 30 is narrowed, a carrier running time between a source and a drain is shortened and thereby the maximum oscillation frequency fmax can be raised.

In the first embodiment, the gate terminal electrode 33, the drain terminal electrode 53 and the source terminal electrode 43 are provided in order to connect the multi-finger electrode 51 with terminal electrodes of a mounting member (package).

In addition, a gate length of the finger gate electrode 30 is as narrow as 1 µm or less for a microwave band. When a gate bus electrode 31 which bundles the plurality of finger gate electrodes 30 is formed between the finger gate electrode 30 and the gate terminal electrode 33, the finger gate electrodes 30 can operate more uniformly.

The drain terminal electrode 53a is connected to the finger drain electrodes 50a of the cell 52a so as to bundle the finger drain electrodes 50a in common. The drain terminal electrode 53b is connected to the finger drain electrodes 50b of the cell region 52b so as to bundle the finger drain electrodes 50b in common.

The drain terminal electrodes 53a and 53b are provided in one side about the first straight line 90. The finger drain electrodes 50a of multi-finger electrodes 51a are connected to the drain terminal electrode 53a together with finger drain electrodes of multi-finger electrodes of adjoining cells where extension lines of multi-finger electrodes cross in above-mentioned one side. Similarly, the finger drain electrodes 50b of multi-finger electrodes 51b are connected to the drain terminal electrode 53b together with finger drain electrodes of multi-finger electrodes of adjoining cells where extension lines of multi-finger electrodes cross in above-mentioned one side.

The source terminal electrodes 43a, 43b and 43c are provided in another side about the first straight line 90. Half of the finger source electrodes 40a and 40b of multi-finger electrodes 51a and 51b of adjoining cells whose extension lines of multi-finger electrodes cross in above-mentioned another side are connected to the same source terminal electrodes 43b. And another half of the finger source electrodes 40a and 40b are connected to the source terminal electrodes 43a or 43c. In addition, the source terminal electrode 43 (43a, 43b, 43c) is grounded via an conductive layer of an inner wall of a via hole 80 provided in the semiconductor layer. Thus, good grounding is obtained also at the microwave band.

In addition, the finger gate electrodes 30a of the first multi-finger electrode 51a are connected with the gate terminal electrode 33 via a gate bus electrode 31a and a gate lead-out part 32a of a length GA. In addition, the finger gate electrodes 30b of the second multi-finger electrode 51b are connected with the gate terminal electrode 33 via the gate bus electrode 31b and a gate lead-out part 32b of a length GB.

The gate terminal electrode 33 is provided in another side about the first straight line 90. Another side is the same side as the source terminal electrode 43. The gate terminal electrode 33 is connected to finger gate electrodes of multi-finger electrodes of adjoining cells whose extension lines of multi-finger electrodes cross in above-mentioned another side.

The gate terminal electrodes and the drain terminal electrodes are alternately provided one side and another side along the first straight line 90.

As shown in FIG. 2A, an open angle $\alpha g$ which the second straight line 92 and the finger gate electrode 30a make, and an open angle $\beta g$ which the second straight line 92 and the finger gate electrode 30b make are the same in abbreviation. Thus, a phase difference is reduced which is caused by a difference of lengths of bonding wires which connect the drain electrodes 53 and an output matching circuit provided on the mounting member, and thereby each cell 52 can operate with sufficient balance.

In FIG. 2A, a finger length FL of the cell 52a, 52b is 100 µm, for example. In addition, since SiC and GaN have a wideband gap and have a high thermal conductivity, SiC and GaN can realize high electric power density easily.

The operation region is divided to the plurality of cells, a loop oscillation is suppressed, and output of the plurality of the cells is combined without producing a phase difference, and thereby a high amplification output can be obtained.

FIG. 2C is a schematic cross section of the field effect transistor. Semiconductor layers, such as a GaN layer 12, an electronic supply layer 14 which is made of AlGaN etc., a source contact layer 15, and a drain contact layer 16, are laminated on a supporting substrate 10 which is made of SiC etc. The GaN layer 12 and the electronic supply layer 14 constitute the active layer 17.

The finger gate electrode 30 is provided on a surface of the operation layer 17. The source contact layer 15 and the drain contact layer 16 are provided on the surface of the active layer 17 so that the source contact layer 15 and the drain contact layer 16 may sandwich the finger gate electrode 30. The finger source electrode 40 and the finger drain electrode 50 are provided on the source contact layer 15 and the drain contact layer 16, respectively. The field effect transistor like this can be called an HEMT (High Electron Mobility Transistor.)

GaN has a high saturation electron speed and high dielectric breakdown withstand voltage, and can be used for a high-power amplification element which operates at a frequency not less than the microwave band. Note that an n-type GaAs layer which constitutes a Shottky barrier with the finger gate electrode 30 may be used as the active layer 17, for example.

In the first embodiment, the drain terminal electrode 53 is formed in one side about the first straight line 90, and the gate terminal electrode 33 is formed in another side about the first straight line 90. The length of each bonding wire for the drain terminal electrode 53 is made uniform and the length of each bonding wire for the gate terminal electrode 33 is made uniform, and thereby the plurality of cells 52 can operate with sufficient balance.

For example, a crossing angle $\gamma$ ($=\alpha g+\beta g$) of the finger gate electrodes of the two multi-finger electrodes 51a and 51b is preferably a right angle. That is, as for the crossing angle $\gamma$, it is preferred to be 80 degrees or more and 100 degrees or less, and it is more preferred to be 85 degrees or more and 95 degrees or less.

In this specification, an "approximate right angle" shall mean an "angle which is not less than 80 degrees and not more than 100 degrees." That is, the "approximate right angle" shall mean an angle of the range of 80-100 degrees.

In the field effect transistor of the first embodiment shown in FIG. 1, the cell has a finger gate electrode which has a finger length of 100 µm. Heat resistance is 0.92 degree Celsius/W and is reduced abbreviated 20% to a field effect transistor concerning a fifth comparative example shown in FIG. 10. As for the field effect transistor of the fifth comparative example, a plurality of cells crowds in a horizontal line, and thereby heat resistance is 1.11 degrees Celsius/W. Note that, in a case of GaAs, since GaAs has a low thermal conductivity, a chip thickness is made thin to about 30 µm in order to reduce heat resistance. On the other hand, since a thermal conductivity of GaN or SiC is higher than a thermal conductivity of GaAs, a chip thickness of GaN or SiC does not limit heat dissipation nature. Accordingly, a thick chip can be used for the field effect transistor, and as a result, a chip of a larger area can be used.

Further, each cell is provided on one straight line, and each cell is rotated 45 degrees to the straight line. Thus, a length between the gate terminal electrode 33 and an edge of the semiconductor chip 6 becomes uniform. As the result, a length of bonding wires 78 which connect the gate terminal electrode 33 and a conductive part of the input circuit board 75 become uniform. In addition, a length between the drain terminal electrode 53 and an edge of the semiconductor chip 6 becomes uniform. As the result, a length of bonding wires 79 which connect the drain terminal electrode 53 and a conductive part of the output circuit board 76 become uniform. Therefore, a radio frequency characteristic becomes more uniform.

Second Embodiment

Figure 8A:
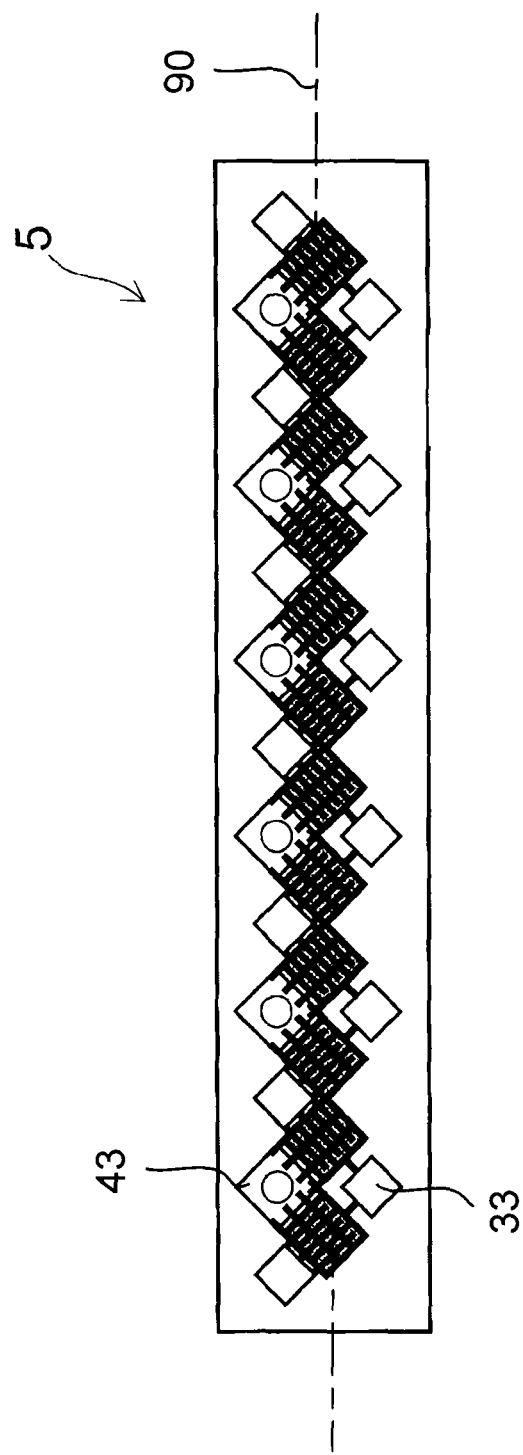
FIG. 8A is a schematic top view of a field effect transistor concerning a second embodiment.
Figure 8B:
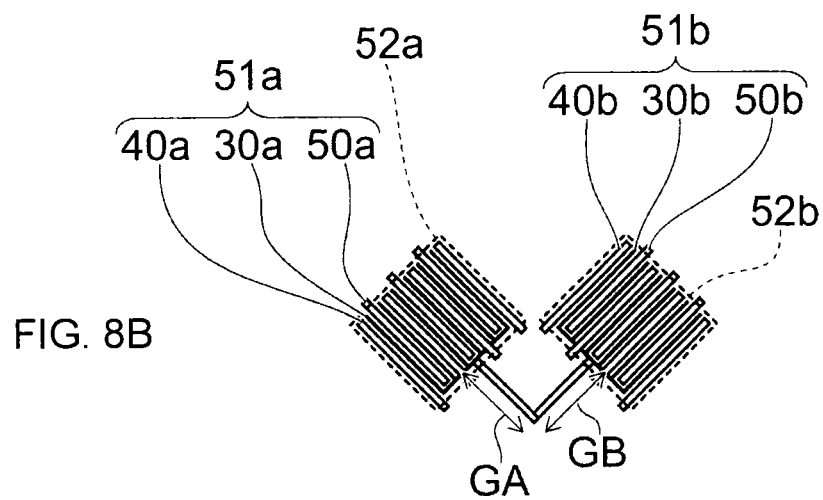
FIG. 8B is a schematic top view of two adjoining cells of the field effect transistor concerning the second embodiment.
Figure 8C:
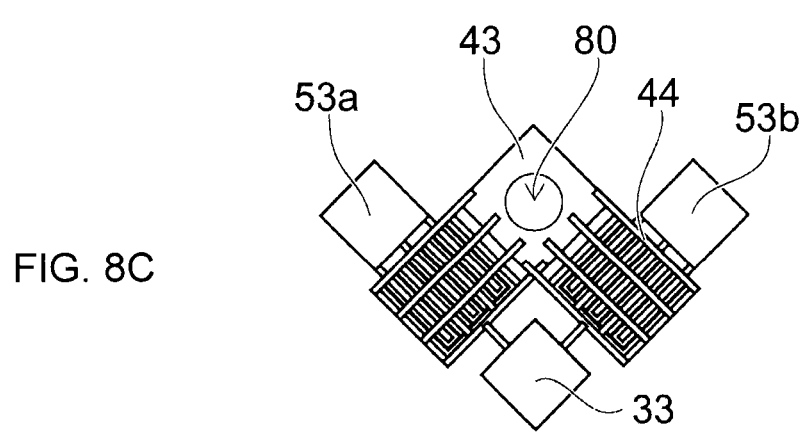
FIG. 8C is a schematic top view showing multi-finger electrodes and terminal electrodes of the field effect transistor concerning the second embodiment.

FIG. 8A is a schematic top view of a field effect transistor concerning a second embodiment. FIG. 8B is a schematic top view of two adjoining cells of the field effect transistor concerning the second embodiment. FIG. 8C is a schematic top view of multi-finger electrodes and terminal and terminal electrodes of the field effect transistor concerning the second embodiment. As for this field effect transistor, a source terminal electrode 43 is located in a region opposite to a region at which a gate terminal electrode 33 is located about the first straight line 90.

As shown in FIG. 8C, wirings which connect the finger source electrodes 40a and 40b of the multi-finger electrodes 51a and 51b to the source terminal electrode 43 are wired in three dimensions by air bridges 44 so that the wirings which connect the finger source electrodes 40a and 40b with the source terminal electrode 43 may not contact the finger gate electrodes 30a and 30b and the finger drain electrodes 50a and 50b.

In addition, the source terminal electrode 43 can be grounded via a conductive layer which covers an inner wall of a via hole 80 provided in a semiconductor substrate. The source terminal electrode 43 can also be grounded using a bonding wire, without forming the via hole.

Third Embodiment

Figure 9:
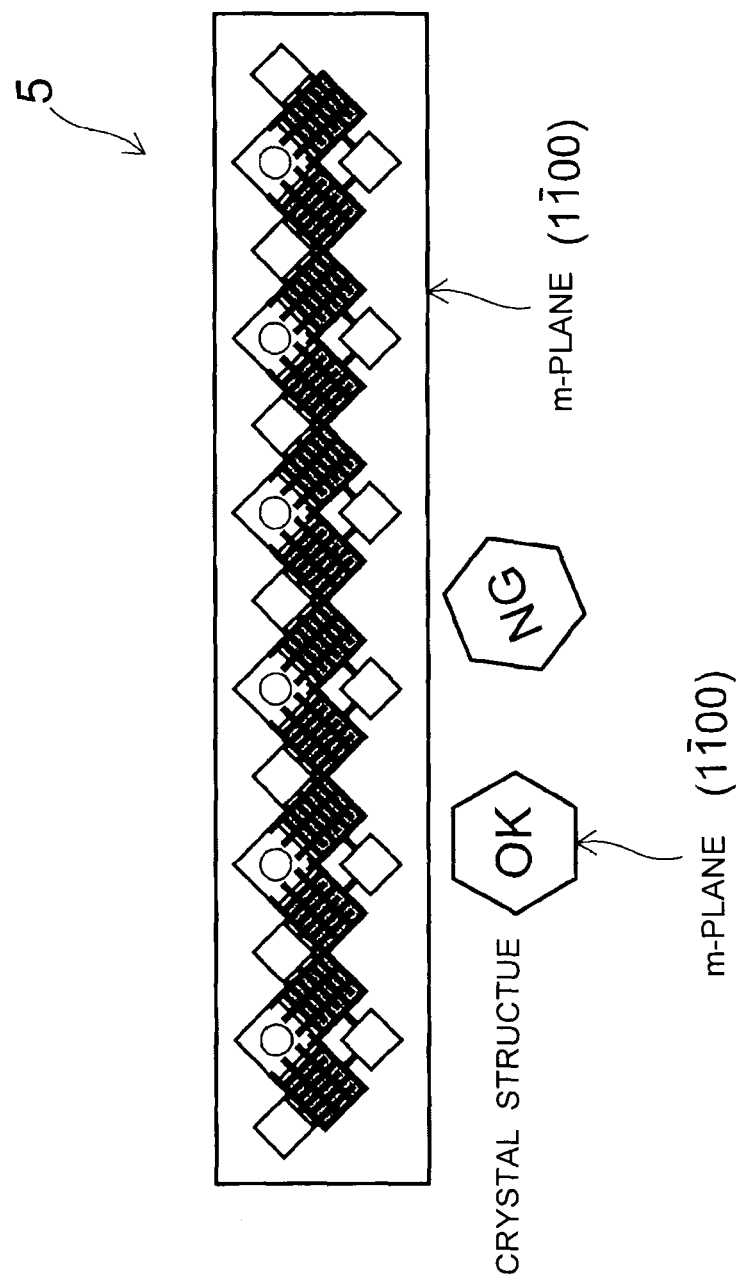
FIG. 9 is a schematic top view of a field effect transistor concerning a third embodiment.

FIG. 9 is a schematic top view of a field effect transistor concerning the third embodiment. In a case that an active layer 17 is a hexagonal system crystal of GaN etc., m-plane (non-polar face) is made parallel to the first straight line 90, and an open angle αg is made 45 degrees and an open angle βg is made 45 degrees. Note that the open angle αg and the open angle βg mean the angles which finger gate electrodes of multi-finger electrodes which cross the second straight line 92 which crosses perpendicularly with the first straight line 90, as shown in FIG. 2A. By doing in this way, the electrical property of the plurality of cells 52 can be made uniform.

On the other hand, when the multi-finger electrodes are set so that the open angle αg is 0 degree and the open angle βg is 90 degrees, the cells 52 differ in electrical properties each other, and thereby this arrangement is not preferable.

As for the field effect transistor 5 concerning the first embodiment, the second embodiment, and the third embodiment, the heat generating regions of the chip are arranged dispersedly, and the loop oscillation can be suppressed easily. For this reason, the field effect transistor 5 concerning the embodiments can attain a high amplification output.

Fourth Embodiment

Figure 5:
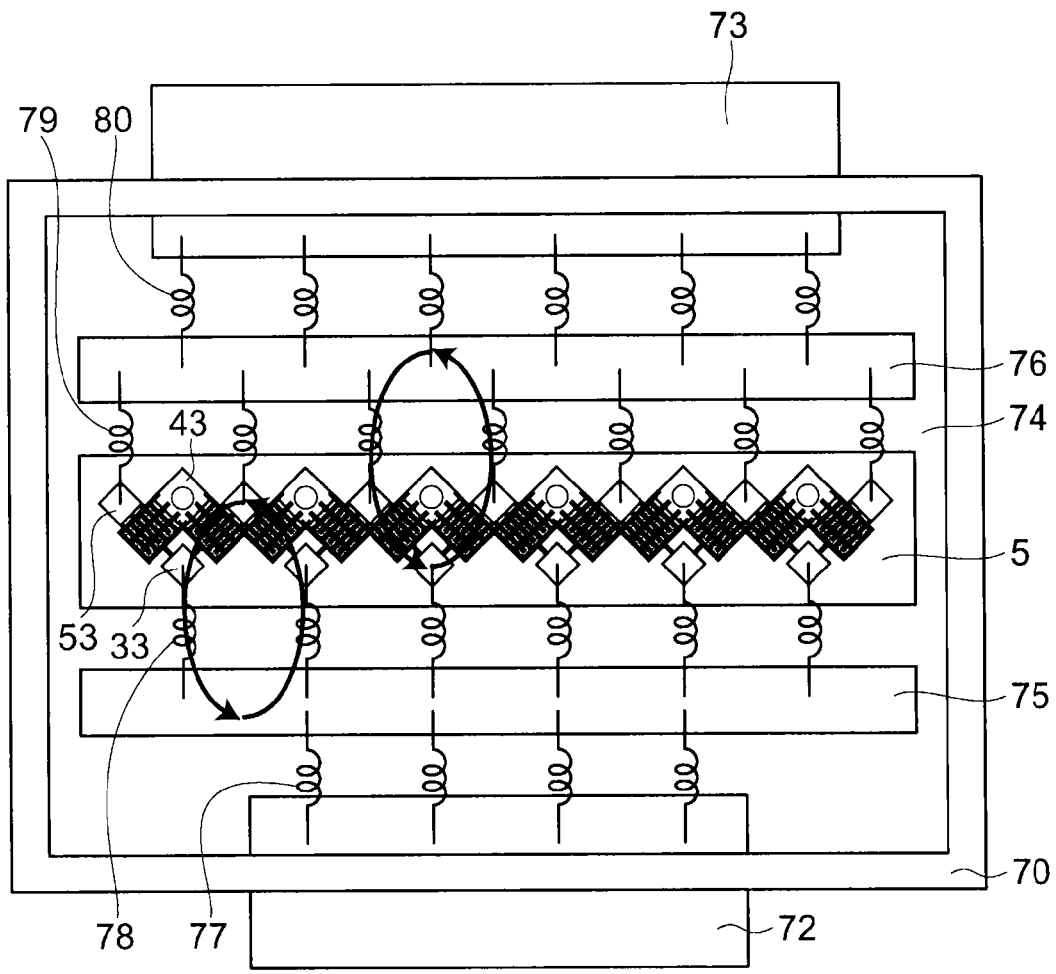
FIG. 5 is a schematic top view of a semiconductor device concerning a fourth embodiment.

FIG. 5 is a schematic top view of a semiconductor device concerning the fourth embodiment which uses the field effect transistor concerning the second embodiment which is shown in FIGS. 8A, 8B and 8C. The semiconductor device has a field effect transistor 5 concerning the second embodiment shown in FIG. 8A, a mounting member (package) 70, an input circuit board 75, and an output circuit board 76.

The mounting member 70 which is made of insulating material, such as ceramics, and metal plate, etc. has an input conductive part 72, an output conductive part 73 and a ground conductor part 74. The input circuit board 75 which is made of ceramics etc. is provided between the input conductive part 72 and the field effect transistor 5, and is bonded to the ground conductor part 74. The output circuit board 76 which is made of ceramics etc. is provided between the output conductive part 73 and the field effect transistor 5, and is bonded to the ground conductor part 74.

As for each cell 52, the drain terminal electrode 53 is connected to a conductive part of the output circuit board 76 by a bonding wire 79. In addition, the gate terminal electrode 33 is connected to a conductive part of the input circuit board 75 by a bonding wire 78.

As shown in FIG. 5, the drain terminal electrode 53 and the gate terminal electrode 33 are connected to the different adjoining cells respectively in the field effect transistor 105. For this reason, the drain terminal electrode 53, the gate terminal electrode 33 and cells which are connected to the terminal electrodes 53 and 33 do not form a loop circuit within a chip. Loop circuits are constituted by including external circuits out of the chip. Therefore, the semiconductor device concerning this embodiment can suppress an unnecessary oscillation by harmonics etc. easily by using an external circuit.

According to the embodiments, a field effect transistor and a semiconductor device which can suppress loop oscillations and reduce thermal resistance with ease can be provided.

Comparative Example 1

Figure 3:
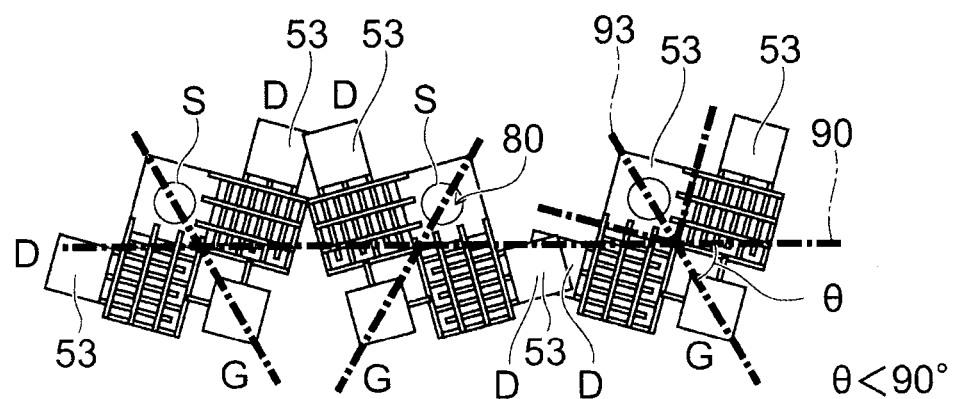
FIG. 3 is a schematic top view of a field effect transistor concerning a first comparative example.

FIG. 3 is a schematic top view of a field effect transistor concerning the first comparative example. In the first comparative example, a first straight line 90 and a third straight line 93 do not cross perpendicularly. That is, a crossing angle θ which the first straight line 90 and the third straight line 93 make is not right-angle. In this case, each drain terminal electrode 53 differs in a distance from the chip end face (it corresponds to the reference number 7 in FIG. 1) for each cell. That is, since a length of a bonding wire which connects the drain terminal electrode 53 and an output matching circuit provided on a mounting member varies with a position of the drain terminal electrode 53, an inductance of the bonding wire varies. Therefore, each cell 52 tends to produce imbalance in operation, then a radio frequency characteristic does not become more uniform.

Comparative Example 2

Figure 4:
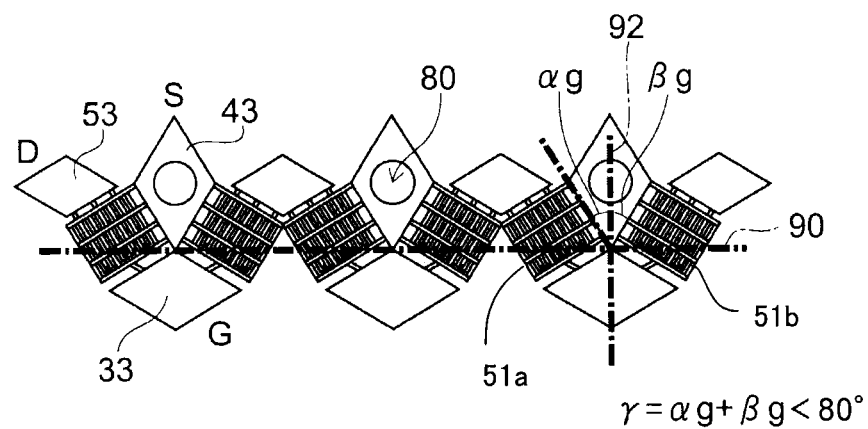
FIG. 4 is a schematic type top view of a field effect transistor concerning a second comparative example.

FIG. 4 is a schematic top view of a field effect transistor concerning the second comparative example. In the second comparative example, a second straight line 92 and a finger gate electrode of multi-finger electrode 51a cross by angle αg (0 degree<αg<80 degrees.) In addition, the second straight line 92 and a finger gate electrode of multi-finger electrode 51b cross by angle βg (0 degree<βg<80 degrees.) Further, αg+βg<80 degrees.

For example, if the crossing angle γ (=αg+βg) of finger gate electrodes of the two multi-finger electrodes 51a and 51b is 60 degrees, a plane shape of the source terminal electrode 43 will be restrained. In addition, when a via hole 80 is formed in the source terminal electrode 43, the plane shape of the source terminal electrode 43 becomes narrow, and thereby the position of the via hole 80 becomes far from the finger gate electrodes. For this reason, a frequency characteristic may degrade.

Comparative Example 3

Figure 6A:
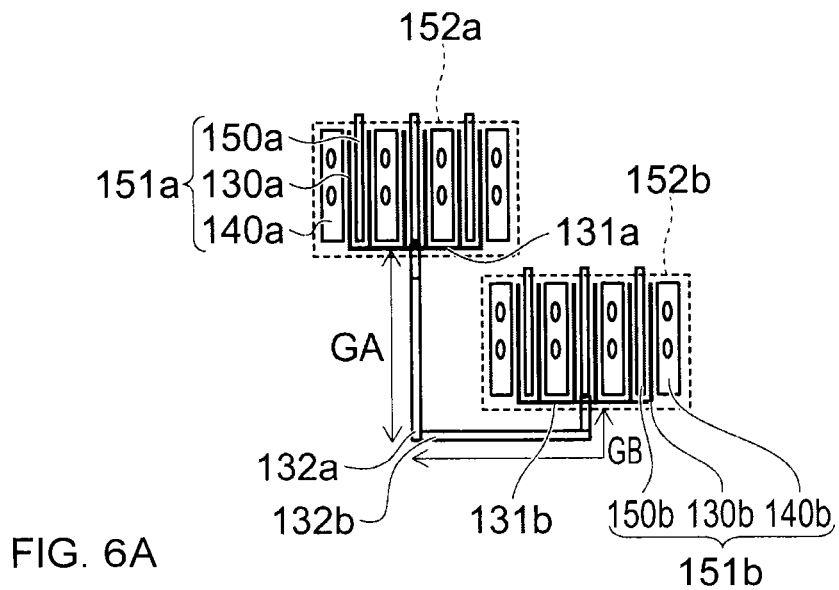
FIG. 6A is a schematic top view of two adjoining cells of a field effect transistor concerning a third comparative example.
Figure 6B:
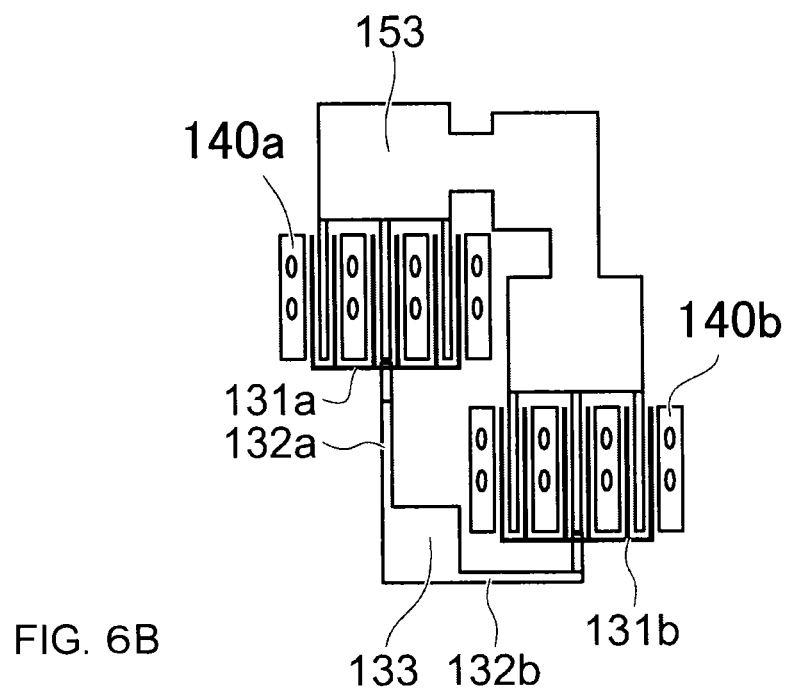
FIG. 6B is a schematic top view showing multi-finger electrodes and terminal electrodes of the field effect transistor concerning the third comparative example.

FIG. 6A is a schematic top view of two adjoining cells concerning the third comparative example, and FIG. 6B is a schematic top view which shows multi-finger electrodes and terminal electrode of a field effect transistor. In FIG. 6A, a first cell 152a and a second cell 152b are provided on a chip surface, and the cell 152a and the cell 152b are mutually shifted in a length direction of a multi-finger electrode 151a. In addition, a multi-finger electrode 151b of the second cell 152b is provided in parallel with the multi-finger electrode 151a of the first cell 152a. A length GA of a gate lead-out part 132a for a gate bus electrode 131a of the multi-finger electrode 151a is the same as a length GB of a gate lead-out part 132b for a gate bus electrode 131b of the multi-finger electrode 151b.

In FIG. 6B, a gate terminal electrode 133 is connected to the gate lead-out parts 132a and 132b. In addition, source electrodes 140a and 140b are connected with conductive layers provided in inner walls of via holes. Further, a drain terminal electrode 153 is connected to finger drain electrodes 150a and 150b.

In the third comparative example, six finger gate electrodes are provided for one cell. A finger length of each finger gate electrode 130a, 130b is 100 μm. A field effect transistor of the third comparative example contains these 12 cells.

Comparative Example 4

Figure 7:
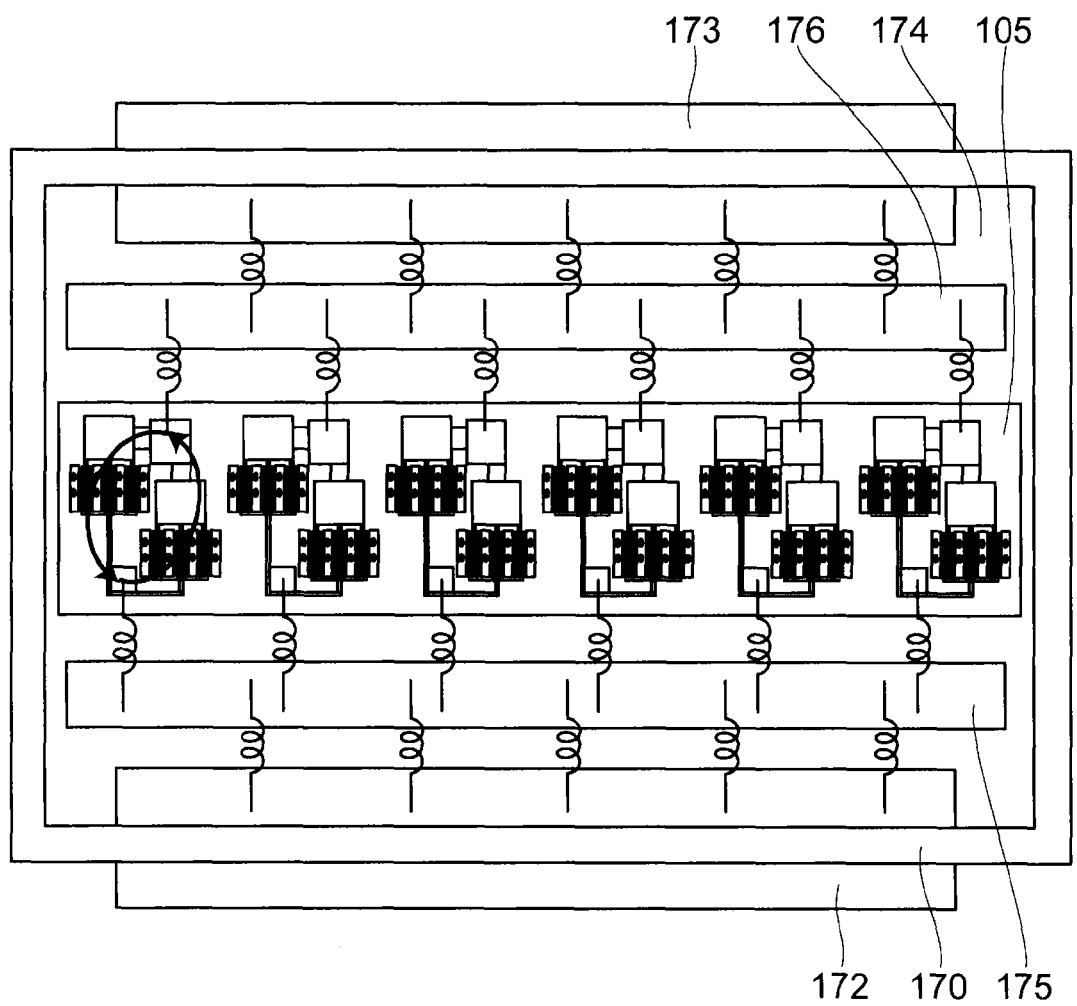
FIG. 7 is a schematic top view of a semiconductor device concerning fourth comparative example using the field effect transistor concerning the third comparative example.

FIG. 7 is a schematic top view of a semiconductor device of the fourth comparative example using the field effect transistor concerning the third comparative example. The semiconductor device has the field effect transistor 105 concerning the third comparative example, a mounting member 170, an input circuit board 175, and an output circuit board 176.

The mounting member 170 has an input conductive part 172, an output conductive part 173, and a ground conductor part 174. The input circuit board 175 is provided between the input conductive part 172 and the field effect transistor 105, and is bonded to the ground conductor part 174. The output circuit board 176 is provided between the output conductive part 173 and the field effect transistor 105, and is bonded to the ground conductor part 174.

As shown in FIG. 6B, the drain terminal electrode 153 and the gate terminal electrode 133 are connected to the same adjoining cells, the first cell 152a and the second cell 152b in the field effect transistor 105. For this reason, the drain terminal electrode 153, the gate terminal electrode 133, the first cell 152a and the second cells 152b form a loop circuit within a chip. When an oscillation is produced by the loop circuit in the chip, it is difficult to suppress an oscillation in the exterior of the chip. That is, it is difficult to suppress the oscillation by an external circuit containing a matching circuit.

Comparative Example 5

Figure 10:
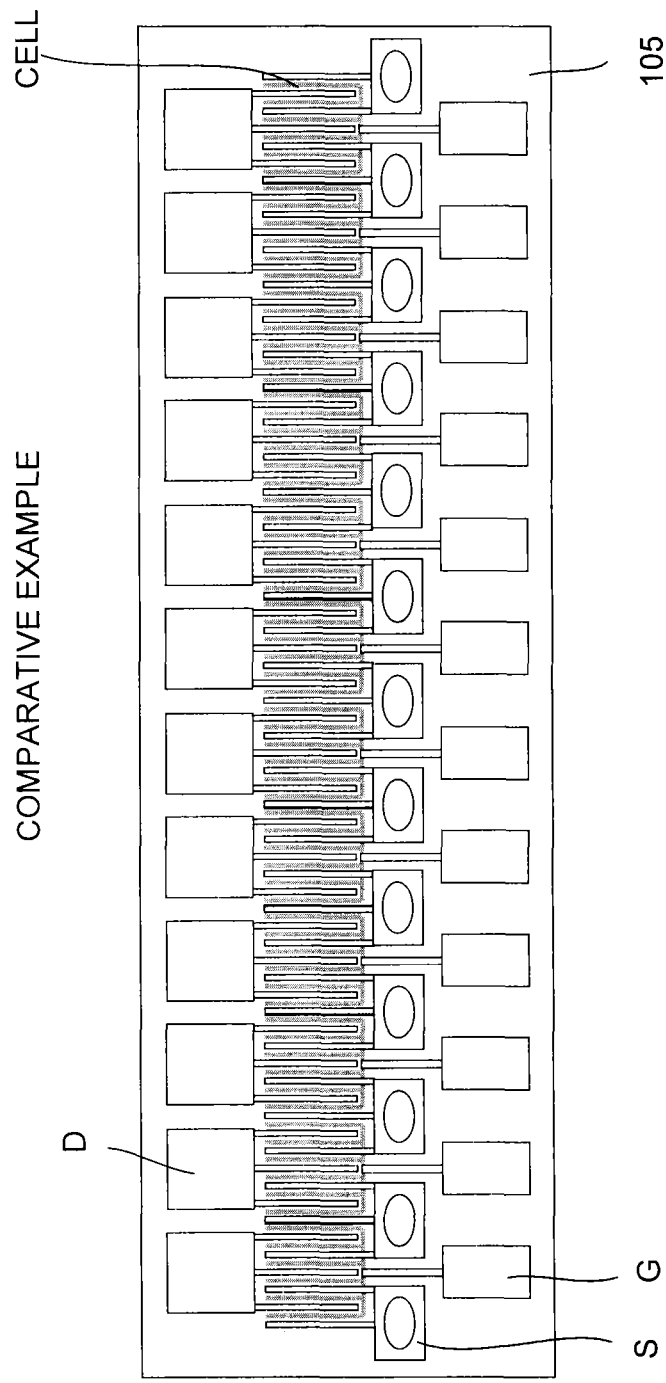
FIG. 10 is a schematic top view of a field effect transistor concerning a fifth comparative example.

FIG. 10 is a schematic top view of the field effect transistor of the fifth comparative example. A plurality of cells is aligned in a horizontal line and is crowded. The heat resistance is 1.11 degrees Celsius/W.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An field effect transistor comprising:
    a plurality of cells provided in a line, each cell having a multi-finger electrode which is provided on an active layer made of semiconductor and which controls an operation current, wherein the multi-finger electrode has at least two finger gate electrodes and a finger drain electrode and a finger source electrode which sandwiches the finger gate electrode, and wherein the finger gate electrode, the finger drain electrode and the finger source electrode are parallel each other in one cell;
    a plurality of gate terminal electrodes, each gate terminal electrode to which each finger gate electrode of two adjoining cells is connected common; and
    a plurality of drain terminal electrodes, each drain terminal electrode to which each finger drain electrode of two adjoining cells is connected common;
    wherein an extension line of the finger gate electrode of one cell of two adjoining cells and an extension line of the finger gate electrode of another cell of the two adjoining cells cross at an angle of the range of 80-100 degrees,
    wherein the multi-finger electrodes of the plurality of the cells are provided in a zigzag line along a first straight line passing through centers of the plurality of cells,
    wherein the gate terminal electrode is provided in a region where an extension line of the finger gate electrode of one cell of two adjoining cells and an extension line of the finger electrode of another cell of the two adjoining cells cross on one side of the first straight line,
    wherein the drain terminal electrode is provided in a region where an extension line of the finger gate electrode of one cell of two adjoining cells and an extension line of the finger gate electrode of another cell of the two adjoining cells cross on another side of the first straight line, and
    wherein the gate terminal electrodes and drain terminal electrodes are provided in a zigzag alignment along the first straight line.

2. The field effect transistor according to the claim 1, further comprising a plurality of source terminal electrodes, each source terminal electrode connected to at least two finger source electrodes of the multi-finger electrode.

3. The field effect transistor according to the claim 2, wherein the source terminal electrode bundles finger source electrodes of two adjoining multi-finger electrodes in common, and is connected to a conductive layer formed in an inner wall of a via hole which is provided in the active layer.

4. The field effect transistor according to the claim 1, wherein the cell has a gate bus electrode which bundles at least two of the finger gate electrodes and which is connected to the gate terminal electrode.

5. The filed effect transistor according to the claim 1, wherein the active layer consists of a hexagonal system semiconductor, and the first straight line is parallel to m-plane of the hexagonal system semiconductor.

6. The field effect transistor according to the claim 1, wherein a crossing angle of the extension line of the finger gate electrode of the multi-finger electrode of one cell of the two adjoining cells and the extension line of the finger gate electrode of the multi-finger electrode of another cell of the two adjoining cells is a right angle.

7. The field effect transistor according to the claim 4, wherein the gate terminal electrode and the gate bus electrode is connected by a gate lead-out part.

8. The semiconductor device comprising:
a field effect transistor comprising:
   a plurality of cells provided in a line, each cell having a multi-finger electrode which is provided on an active layer made of semiconductor and which controls an operation current, wherein the multi-finger electrode has at least two finger gate electrodes and a finger drain electrode and a finger source electrode which sandwiches the finger gate electrode, and wherein the finger gate electrode, the finger drain electrode and the finger source electrode are parallel each other in one cell;
   a plurality of gate terminal electrodes, each gate terminal electrode connected common to each finger gate electrode of two adjoining cells; and
   a plurality of drain terminal electrodes, each drain terminal electrode connected common to each finger drain electrode of two adjoining cells;
   wherein an extension line of the finger gate electrode of one cell of two adjoining cells and an extension line of the finger gate electrode of another cell of the two adjoining cells cross at an angle of the range of 80-100 degrees,
   wherein the multi-finger electrodes of the plurality of the cells are provided in a zigzag line along a first straight line passing through the centers of the plurality of cells,
   wherein the gate terminal electrode is provided in a region where an extension line of the finger gate electrode of one cell of the two adjoining cells and an extension line of the finger gate electrode of another cell of the two adjoining cells cross on one side about the first straight line,
   wherein the drain terminal electrode is provided in a region where an extension line of the finger gate electrode of one cell of two adjoining cells and an extension line of the finger gate electrode of another cell of the two adjoining cells cross on another side about the first straight line, and
   wherein the gate terminal electrodes and the drain terminal electrodes are provided in a zigzag alignment along the first straight line;
a mounting member which includes an input conductive part, an output conductive part, and a ground conductor part;
an input circuit board which is provided between the input conductive part and the field effect transistor, and is bonded to the ground conductor part;
an output circuit board which is provided between the output conductive part and the field effect transistor, and is bonded to the ground conductor part;
a wiring which electrically connects the output circuit board and the drain terminal electrode of the field effect transistor; and
a wiring which electrically connects the input circuit board and the gate terminal electrode of the field effect transistor;
wherein the gate terminal electrode is connected to adjoining cells in the field effect transistor;
wherein the drain terminal electrode is connected to other adjoining cells in the field effect transistor, and
wherein the gate terminal electrode and the drain terminal electrode which are connected to one cell do not constitute a loop circuit in the field effect transistor.

* * * * *